United States Patent [19]

Ban et al.

[11] 4,082,865
[45] Apr. 4, 1978

[54] METHOD FOR CHEMICAL VAPOR DEPOSITION

[75] Inventors: Vladimir Sinisa Ban, Hopewell, N.J.; Stephen Lee Gilbert, Concord, Vt.

[73] Assignee: RCA Corporation, New York, N.Y.

[21] Appl. No.: 779,679

[22] Filed: Mar. 21, 1977

Related U.S. Application Data

[63] Continuation-in-part of Ser. No. 743,317, Nov. 19, 1976.

[51] Int. Cl.² .............................................. B05D 5/12
[52] U.S. Cl. ...................................... 427/253; 427/86
[58] Field of Search .................................. 118/48–49.5, 118/500, 320, 503, 321; 148/174, 175, 189; 427/50, 51, 86, 69, 70, 167, 78, 91, 99, 109, 124, 107, 166, 255, 248–253

[56] References Cited

U.S. PATENT DOCUMENTS

| | | | |
|---|---|---|---|
| 3,226,254 | 12/1965 | Reuschel | 118/49.5 X |
| 3,461,838 | 8/1969 | Henker | 118/48 |
| 3,472,684 | 10/1969 | Walther | 118/48 X |
| 3,637,434 | 1/1972 | Nakanuma et al. | 118/48 X |
| 3,641,974 | 2/1972 | Yamada et al. | 118/48 |
| 3,783,822 | 1/1974 | Wollam | 118/49.1 |
| 3,900,597 | 8/1975 | Chruma | 118/49 X |
| 3,922,467 | 11/1975 | Pinchon | 118/48 X |
| 3,934,060 | 1/1976 | Burt et al. | 118/49 X |
| 4,018,183 | 4/1977 | Meuleman | 118/49 |

FOREIGN PATENT DOCUMENTS 1,199,648  7/1970  United Kingdom ................. 148/149

OTHER PUBLICATIONS

*IBM Technical Disclosure Bulletin,* "Emitter Diffusion System", Eshbach et al., vol. 13, No. 6, [Nov. 1970], p. 1459.

*Primary Examiner*—Morris Kaplan
*Attorney, Agent, or Firm*—H. Christoffersen; T. H. Magee

[57] ABSTRACT

An apparatus for chemically vapor-depositing a material onto surfaces of a plurality of substrates within a reaction chamber comprises means positioned within the chamber for supporting the substrates in a stack-like relationship wherein the surfaces are substantially parallel to each other and are separated by spacings, and a plurality of gas nozzles connected to a source of gas and positioned within the chamber so that the flow of gas therefrom is directed, respectively, into the spacings between the surfaces. A method of utilizing this apparatus comprises rotating the substrates while moving the nozzles back and forth in an arc, so that the flow of gas therefrom is directed into the spacings at different angles. Uniform deposition of the material onto the substrates is further improved by maintaining the pressure of the gas within the chamber between about 1 and 100 Torr.

7 Claims, 3 Drawing Figures

METHOD FOR CHEMICAL VAPOR DEPOSITION

This application is a Continuation-in-Part application of U.S. Pat. application Ser. No. 743,317, filed on Nov. 19, 1976.

The invention relates to a method of chemically vapor-depositing a material onto surfaces of a plurality of substrates within a reaction chamber.

Chemical vapor deposition (CVD) is a method of forming a layer of material on a substrate, such as an epitaxial layer on a silicon wafer, wherein deposits are produced by heterogeneous gas-solid or gas-liquid chemical reactions at the surface of the substrate. A volatile compound of the element or substance to be deposited is introduced and thermally decomposed, or reacted with other gases or vapors, at the surface of the substrate to yield non-volatile reaction products which deposit on the substrate surface. Chemical vapor-deposition processes involving silicon wafers are typically performed at high temperatures in reaction chambers wherein the wafers are supported and heated on graphite susceptors.

Various types of susceptors have been utilized for supporting substrates during the chemical vapor-deposition process. In one type of apparatus, illustrated in U.S. Pat. No. 3,461,836, issued to Henker on Aug. 19, 1969, the substrates are arranged on a surface of a flat elongated graphite susceptor disposed in a long cylindrical quartz. Typically, one end of the susceptor is raised above the other end to facilitate a uniform deposition thickness across the surfaces of the substrates. In another type of apparatus, the substrates are mounted on the sides of a barrel susceptor which may be shaped similar to a vertical truncated pyramid, or a horizontal prismatic configuration as illustrated in U.S. Pat. No. 3,637,434, issued to Nakanuma et al. on Jan. 25, 1972.

It is also known to support plate-shaped substrates in a CVD process by placing the substrates upon each other to form a rod-shaped stack wherein the average distance between the substrates is between about 10 to 15 micrometers. The stack is then subjected to a flow of gas containing a gaseous compound of the semiconductor substance to be deposited, mixed with a gaseous reaction agent. Simultaneously, the stack is heated, preferably by radiation or by electric inductance heating, to the pyrolytic temperature required for reducing the semiconductor substance from the gaseous compound and precipitating it upon the heated substrates. The above-described method is disclosed in U.S. Pat. No. 3,226,254 issued to Reuschel on Dec. 28, 1965. In this method the temperature involved must be high enough to give the gas sufficient mobility to enter the small spaces between the substrates and precipitate over the entire surface of each substrate. However, even at sufficiently high temperatures, the deposition of material onto the substrates is non-uniform in thickness, making the substrates undesirable for use in manufacturing semiconductor devices.

Figure 1:
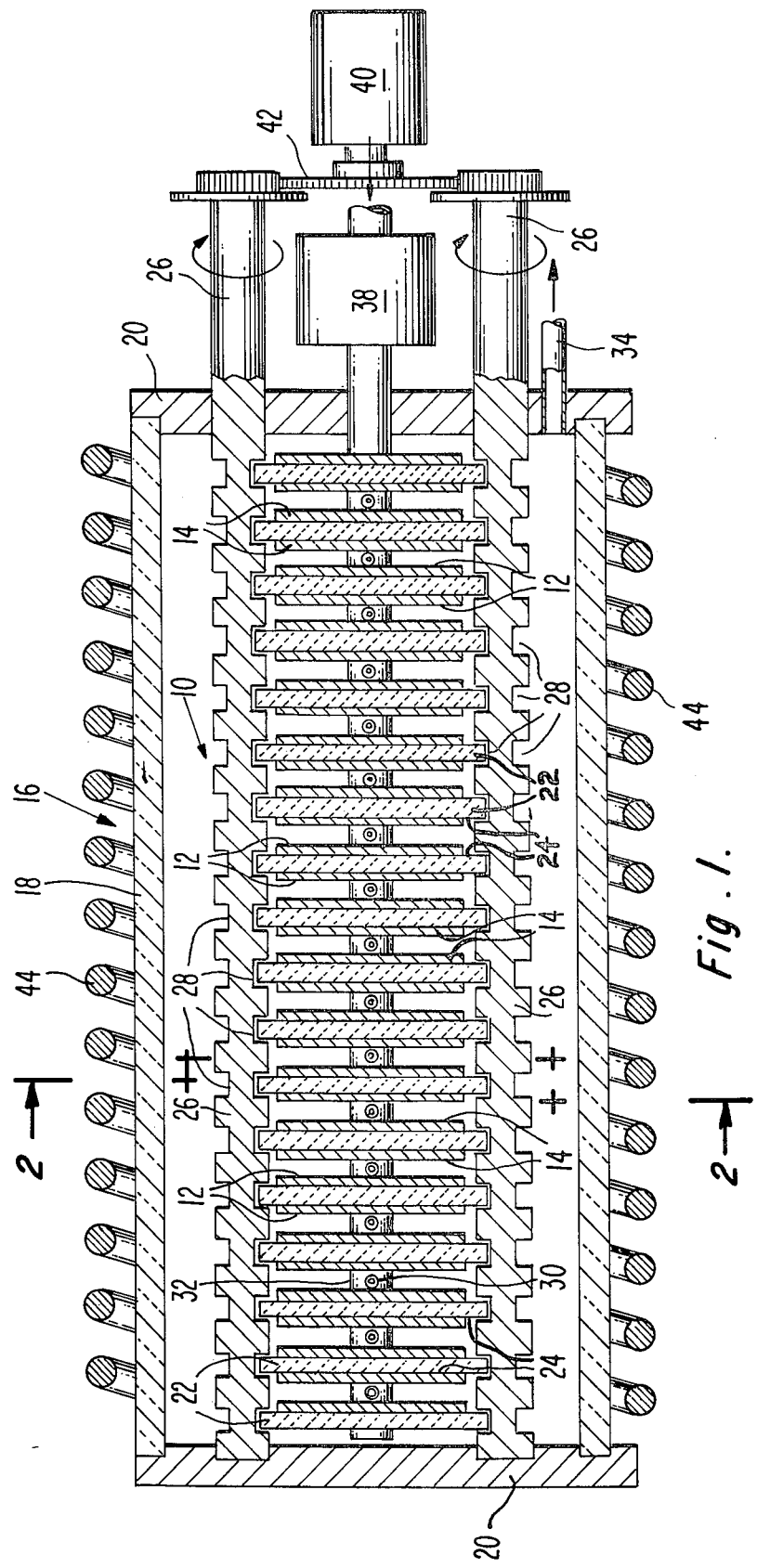
FIG. 1 is a partial, cross-sectional view illustrating one embodiment of the present novel apparatus.
Figure 2:
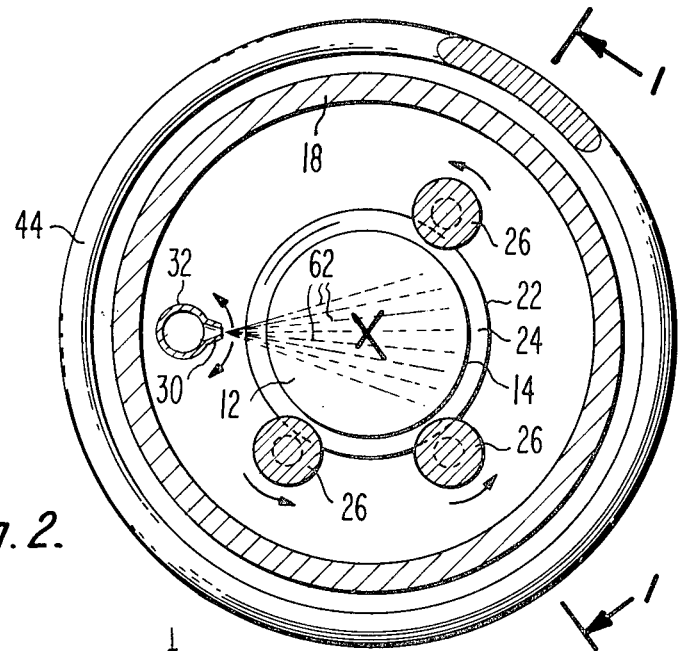
FIG. 2 is a cross-sectional view taken along line 2—2 of FIG. 1.

FIGS. 1 and 2 show a novel apparatus 10 for chemically vapor-depositing a material onto surfaces 12 of a plurality of substrates 14 within a reaction chamber 16. In the present drawings, the reaction chamber 16 comprises a cylindrical quartz tube 18 having each end thereof covered by a metallic end section 20.

The novel apparatus 10 further comprises means positioned within the chamber 16 for supporting the substrates 14 in a stack-like relationship wherein the surfaces 12 are substantially parallel to each other and are separated by spacings, as shown in FIG. 1. In the preferred embodiment, the supporting means comprises a plurality of plate-shaped susceptors 22 positioned so that the major surfaces 24 thereof are substantially parallel to each other in a stack-like arrangement and separated by a distance between about 1 millimeter and about 10 millimeters. In the present example, each susceptor 22 has two substrates 14 mounted thereon, one on each major surface 24 thereof. The substrates 14 are held adjacent to the susceptors 22 by any suitable holding means, such as circular rings (shown only in FIG. 3) which fit over the edges of the substrates 14 and attach to the major surfaces 24 of the susceptors 22.

The supporting means further comprises means connected to the susceptors 22 for retaining the susceptors 22 in the stack-like arrangement. Referring to the embodiment shown in FIG. 1, the retaining means comprises a plurality of rods 26 supported by the end sections 20 of the chamber 16. The rods 26 have retaining grooves 28 therein disposed adjacent to the edges of the susceptors 22 for maintaining the susceptors 22 parallel to each other and at the same distance apart from each other. Such rods 26 are preferably made of a material which is both structurally strong and chemically inert in the presence of whatever gases are used in the reaction chambers 16. Typically, molybdenum is used for the rods 26 in processes where silicon is chemically vapor-deposited. In the present embodiment, three rods are utilized, which are positioned as shown in FIG. 2, for retaining the susceptors 22 in the stack-like arrangement.

The novel apparatus 10 also comprises a plurality of gas nozzles 30 connected to a source of gas (not shown) and positioned within the reaction chamber 16 so that the flow of gas therefrom is directed, respectively, into the spacings between the surfaces 12. The use of the word "nozzle" is meant to include any form of orifice or slit capable of projecting a flow of gas directly into the spacings between the surfaces 12. In the present embodiment, the nozzles 30 are connected to a common inlet pipe 32 through which the gas is introduced. This inlet pipe 32 may enter the chamber 16 through an opening 34 in one of the end sections 20 which also supports the pipe 32. A separate gas nozzle 30 is provided for each spacing so that a direct flow of gas is aimed between each pair of surfaces 12. The nozzles 30 may be of any design including cone-shaped structures, as shown in FIG. 2, or simply outlet holes or slits formed in the inlet pipe 32. An outlet pipe 34 may also be provided, as shown in FIG. 1 for removing consumed reaction gases.

In the preferred embodiment, the novel apparatus 10 further comprises means for moving the nozzles 30 so that the flow of gas therefrom is directed into the spacings between the surfaces 12 at different angles. In the present example, such moving means typically comprises a sweep motor 38, diagrammatically shown in FIG. 1, which is connected to the nozzles 30 via the inlet pipe 32, for continually sweeping the nozzles 30 back and forth in an arc. It is not necessary that the motor 38 move the nozzles at a constant sweep rate. In fact, it may be desirable to have the motor 38 vary (by a mechanical cam arrangement or by means of an electrical servomotor) the sweep rate of the nozzles 30 in accordance with a predetermined program so that the dwell time of the nozzles 30 is greater at preselected segments of the sweep arc.

In the preferred embodiment, the novel apparatus 10 also comprises means connected to the supporting means for rotating the susceptors 22. Referring to FIG. 1, the rotating means comprises a rotation motor 40, diagrammatically illustrated, which is connected to the rods 26 by a typical intermeshing gear arrangement 42 for rotating the rods 26. Since the susceptors 22 are mechanically retained in the stack-like arrangement by the grooves 28 in the rods 26, rotation of the rods 26 in a clockwise manner causes the susceptors 22 to rotate in a counterclockwise manner.

In embodiments wherein the supporting means comprises a plurality of susceptors 22, the apparatus 10 further comprises means for heating the susceptors 22. Although such heating means is illustrated in FIG. 1 as an rf induction coil 44 positioned adjacent the chamber 16 for heating the susceptors 22 by inducing a current therein, such heating means may also comprise any type of resistance or radiation heaters.

Figure 3:
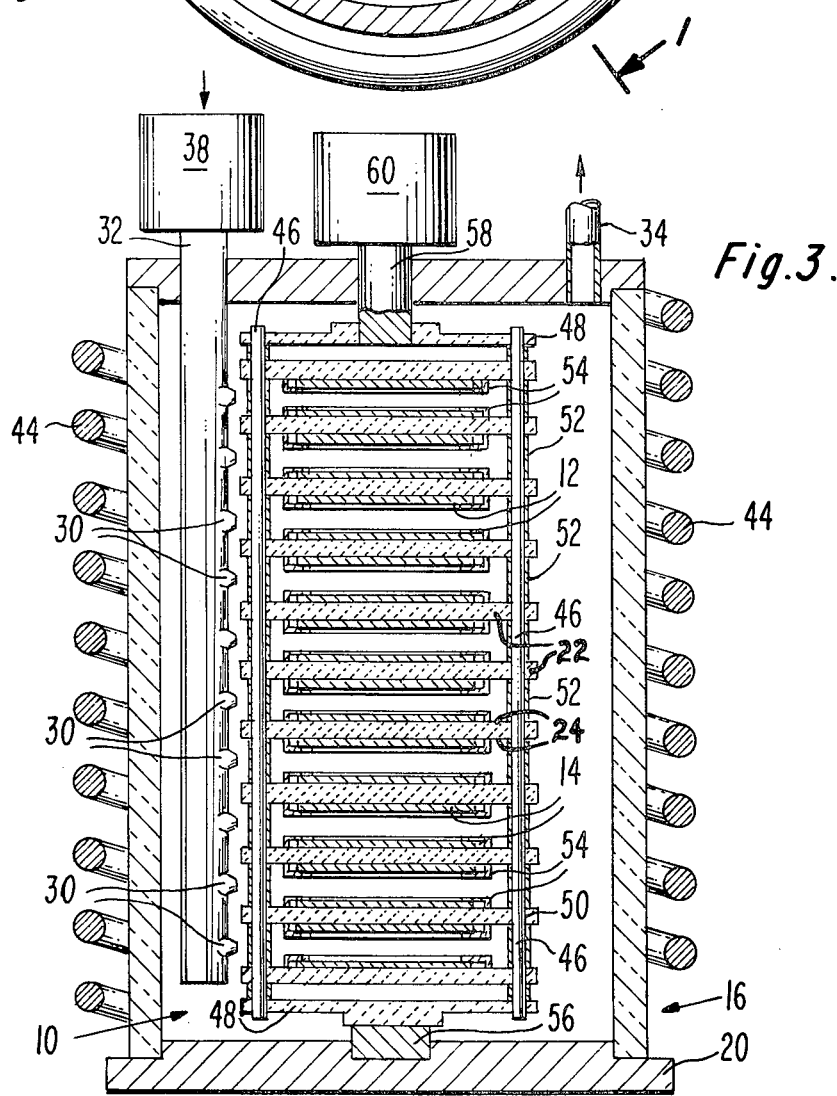
FIG. 3 is a cross-sectional view illustrating a second embodiment of the present novel apparatus.

Referring to FIG. 3 of the drawings, there is shown a second embodiment of the present invention wherein the means for retaining the susceptors 22 in the stack-like arrangement comprises a plurality of holding rods 46 attached to the susceptors 22 and disposed between two end plates 48 connected thereto. The holding rods 46 pass through holes 50 in the susceptors 22 which are spaced apart from each other by cylindrical spacers 52 that are interposed therebetween, as shown in FIG. 3. In this embodiment, the reaction chamber 16 and stack of substrates 22 are disposed vertically, and the apparatus further includes means positioned adjacent to the major surfaces 24 for mounting the substrates 14 thereon. For example, the mounting means may comprise circular rings 54 which fit over the edges of the substrates 14 and attach to the major surfaces 24 of the susceptors 22.

In the embodiment shown in FIG. 3, the rotating means connected to the supporting means comprises two shafts 56 and 58 supported by opposite end sections 20 of the chamber 16 and connected respectively to central portions of the two end plates 48. One shaft 58 is connected to a rotation motor 60, diagrammatically shown in FIG. 3, for rotating the shafts 56 and 58, so that the stack of susceptors 22 is likewise rotated.

The novel apparatus 10 is preferably used for chemically vapor-depositing epitaxial layers of silicon onto the surfaces 12 of the substrates 14, which are typically silicon wafers. The present CVD method comprises supporting the substrates 14 within the reaction chamber 16 in a stack-like arrangement wherein the surfaces 12 are substantially parallel to each other and are separated by spacings, and directing a flow of gas from the gas nozzles 30 into the spacings between the surfaces 12. In the preferred embodiment, the substrates 14 are mounted on the plate-shaped susceptors 22 which are positioned so that the major surfaces 24 thereof are substantially parallel to each other in a stack-like arrangement and separated by a distance between about 1 millimeter and about 10 millimeters. The substrates 14 are heated by the susceptors 22 and the associated rf induction coil 44 to a temperature sufficiently high enough to allow the CVD reaction to occur, typically about 1100° C for depositing silicon epitaxial layers.

Since the spacings between the surfaces 12 of the mounted substrates 14 are less than 10 millimeters, it is necessary to direct a flow of gas from the nozzles 30 into the spacings, in order to insure that gaseous reactants within the chamber 16 are uniformly delivered to all areas of the surfaces 12. The use of the nozzles 30 causes a much larger transfer of reactant gases across the surfaces 12, in comparison with the transfer in laminar flow which is typical of prior art methods. In the preferred embodiment, the gas nozzles deliver a gaseous mixture comprising a vaporized silicon bearing compound, such as silane ($SiH_4$), chlorosilane ($SiClH_3$), dichlorosilane ($SiCl_2H_2$), trichlorosilane ($SiCl_3H$) or silicon tetrachloride ($SiCl_4$), together with a carrier gas such as hydrogen ($H_2$) and also dopant gases if desired. A chemical reaction, such as pyrolysis or hydrogen reduction, at the surfaces 12 of the heated substrates 14, produces silicon which then deposits on the substrates 14. For more detailed information on the temperature and typical concentrations of the reactant gases, see U.S. Pat. No. 3,945,864 issued to Goldsmith et al. on Mar. 23, 1976 and assigned to RCA Corporation, which is incorporated herein by reference. The gas which is directed from the nozzles 30 does not necessarily have to be a reactant gas, but may be a nonreactant gas, whose purpose is to create sufficient turbulence in the spacings to cause the reactant gases within the chamber 16 to be uniformly exposed to all areas of the surfaces 12.

In embodiments where the "nozzles" comprise simply a plurality of orifices or slits capable of projecting a flow of gas directly into the spacings between the surfaces 12, such as a manifold type of arrangement, uniform delivery of the gaseous mixture across the surfaces 12 is further improved by maintaining the pressure of the gas within the chamber 16 below atmospheric pressure. Preferably, the gaseous mixture is maintained at a pressure between about 1 Torr and about 100 Torr. For effective operation of CVD systems, it is necessary that the reactant gases diffuse through the boundary layer which forms adjacent to the exposed surfaces 12. The growth rate, uniformity of thickness, and doping level of the material being deposited on the surfaces 12 depends upon the efficient diffusion of gaseous reactants through this boundary layer. By lowering the pressure of the gas within the chamber 16, the mean free path of the gaseous molecules increases. At sufficiently low pressures, the mean free path approaches the thickness of the boundary layer, which then becomes less of a barrier to the transport of gaseous reactants to the surfaces 12. By utilizing reduced gas pressures in combination with the gas "nozzles" in reaction chambers where the substrates 14 are supported in a close stack-like relationship, uniform delivery of the gaseous mixture across the surfaces 12 is significantly improved. Such a low-pressure method also allows for the chemical vapor deposition of a material onto both sides of the substrates simultaneously. Reduced pressures would offer another advantage due to smaller heat losses in reaction chambers operating under such conditions. Consequently, one is able to more easily maintain proper temperatures and avoid unwanted temperature gradients.

In order to further insure uniform delivery of the gaseous reactants to all areas of the surfaces, it is preferred that the substrates 14 be rotated during the CVD process by rotating the susceptors 22, as described above. Rotation of the substrates results in deposited epitaxial layers which are significantly more uniform in thickness.

The preferred method further comprises the step of continually moving the nozzles 30 back and forth, in an arc, so that the flow of gas therefrom is directed into the spacings at different angles. By continually sweeping the nozzles back and forth in an arc, the flow of gas therefrom, illustrated by dashed lines 62 in FIG. 2, is directed across the entire surfaces 12 of the substrates 14. This sweeping motion, combined with the rotation of the substrates 14, insures a uniform delivery of the gaseous reactants to all areas of the surfaces 12, and thus makes it possible to achieve high uniformity in the thickness and doping of the material being deposited.

In order to further control the thickness of the material being deposited, the sweeping rate of the nozzles 30 may be varied in accordance with a predetermined program so that the dwell time of the nozzles 30 is greater at preselected segments of the sweep arc. We have found that more uniformity in thickness can be obtained by increasing the dwell time of the nozzles 30 at the peripheral segments of the sweep arc. In some applications, it may be desirable to manufacture substrates having epitaxial layers deposited thereon with a particular thickness profile, which is not uniform in thickness. The present apparatus and method provide the capability to produce epitaxial layers having a particular thickness profile, which is dependent upon the type of predetermined program selected for controlling the sweep rate of the nozzles 30.

The novel apparatus 10 and method of the present invention provide for much higher reactor capacity per unit volume, due to the dense packing of the substrates 14 in a so-called "salami" type configuration. The higher capacity results in significantly lower power consumption by reducing heat losses. The close proximity of the susceptors 22 in the stack-like arrangement achieves a more uniform temperature throughout the substrates 14, which leads to better control over the thickness of the material being deposited. The stack-like arrangement of the substrates 14 also results in lower autodoping, due to the fact that the reactant gases pass through single gas passages, i.e., the spacings between the substrates 14, and do not repeatedly pass, by laminar flow, across the surfaces of a plurality of substrates, which is typical of the prior art methods.

The use of the stack-like denser arrangement of the substrates 14 for chemical vapor-deposition is made feasible only by utilizing the gas nozzles 30, which are capable of delivering sufficient gas into the narrow spacings between the substrate surfaces 12 to cause the reactant gases to be uniformly exposed to all areas of the surfaces 12. In addition, by spatially confining the flow of reactant gases to the spacings between the surfaces 14, a much higher utilization of reactant gases is achieved, which increases significantly the efficiency (over 90%) of the CVD reactor. A high uniformity in the thickness of the material being deposited is able to be achieved by sweeping the gas nozzles 30 back and forth in an arc, combined with the rotation of the substrates 14. The novel apparatus and method increases significantly the yield of the substrates available for use in manufacturing semiconductor devices while, at the same time, achieving economies in production through higher reactor efficiency and lower power consumption.

What is claimed is:

1. In a method of chemically vapor-depositing a material onto the surfaces of a plurality of substrates within a reaction chamber wherein said substrates are heated while contacting said surfaces with a gaseous compound of said material to be deposited, the improvement in said method comprising the steps of:

supporting said substrates within said chamber in a stack-like arrangement wherein said surfaces are substantially parallel to each other and are separated by spacings, and directing a flow of gas from a plurality of gas nozzles into said spacings between said surfaces while simultaneously rotating said substrates each about its own axis.

2. A method as recited in claim 1 wherein the pressure of said gas within said reaction chamber is maintained below atmospheric pressure.

3. A method as recited in claim 2 wherein said pressure is between about 1 Torr and about 100 Torr.

4. A method as recited in claim 1 wherein said supporting step is performed by mounting said substrates on the major surfaces of a plurality of plate-shaped susceptors positioned so that said major surfaces are substantially parallel to each other in a stack-like arrangement and separated by a distance between about 1 millimeter and about 10 millimeters.

5. A method as recited in claim 1 further comprising the step of moving said nozzles so that the flow of said gas is directed into said spacings at different angles.

6. A method as recited in claim 5 wherein said moving step is performed by continually sweeping said nozzles back and forth in an arc.

7. A method as recited in claim 6 wherein the sweeping rate of said nozzles is varied in accordance with a predetermined program so that the dwell time of said nozzles is greater at preselected segments of said arc.

* * * * *